United States Patent
Lim et al.

(10) Patent No.: US 9,632,120 B2
(45) Date of Patent: Apr. 25, 2017

(54) SYSTEM AND METHOD FOR MEASURING POWER IN A POWER FACTOR CONVERTER

(71) Applicant: Infineon Technologies Austria AG, Villach (AT)

(72) Inventors: Shu Fan Lim, Singapore (SG); Prashant Sudhakar Gugle, Singapore (SG); Josef Daimer, Singapore (SG)

(73) Assignee: Infineon Technologies Austria AG, Villach (AT)

( * ) Notice: Subject to any disclaimer, the term of this patent is extended or adjusted under 35 U.S.C. 154(b) by 115 days.

(21) Appl. No.: 14/582,994

(22) Filed: Dec. 24, 2014

(65) Prior Publication Data

US 2016/0190912 A1    Jun. 30, 2016

(51) Int. Cl.

| | | |
|---|---|---|
| *G05F 1/70* | (2006.01) | |
| *H02M 1/42* | (2007.01) | |
| *G01R 21/00* | (2006.01) | |
| *G01R 21/06* | (2006.01) | |
| *H02M 1/00* | (2006.01) | |
| *G01R 35/00* | (2006.01) | |
| *G01R 21/133* | (2006.01) | |

(52) U.S. Cl.
CPC .......... *G01R 21/006* (2013.01); *G01R 21/06* (2013.01); *H02M 1/4225* (2013.01); *G01R 21/133* (2013.01); *G01R 35/005* (2013.01); *H02M 2001/0012* (2013.01); *Y02B 70/126* (2013.01)

(58) Field of Classification Search
CPC ...... G05F 1/70; Y02B 70/126; H02M 1/4225; H02M 3/156; H02M 1/42
See application file for complete search history.

(56) References Cited

U.S. PATENT DOCUMENTS

| | | | | |
|---|---|---|---|---|
| 5,959,852 A | * | 9/1999 | Deloy | H02M 1/4225 323/222 |
| 6,373,734 B1 | * | 4/2002 | Martinelli | H02M 1/4225 323/222 |
| 8,755,208 B1 | * | 6/2014 | Ramalingam | H02M 1/32 323/207 |
| 9,054,597 B2 | * | 6/2015 | Zhao | H02M 1/4225 |
| 2005/0219872 A1 | * | 10/2005 | Lys | F21S 48/325 363/21.04 |
| 2008/0316779 A1 | * | 12/2008 | Jayaraman | H02M 1/4225 363/74 |
| 2014/0159693 A1 | * | 6/2014 | Kuang | H02M 1/42 323/285 |
| 2015/0048807 A1 | | 2/2015 | Fan et al. | |

OTHER PUBLICATIONS

"Digital Power Factor Correction Controller with Accurate AC Power Metering," Data Sheet, ADP1047/ADP1048, 2011, 84 pgs.
Huang, K., "ADP1047/ADP1048 Advanced Power Metering," AN-1145 Application Note, Analog Devices, 2012, 12 pages.

* cited by examiner

*Primary Examiner* — Gary L Laxton

(74) *Attorney, Agent, or Firm* — Slater Matsil, LLP

(57) ABSTRACT

A method of measuring an input power of a power factor converter (PFC) includes determining an average of a rectified voltage signal from an input of the PFC, determining an average of an inductor current of the PFC, and determining the input power by multiplying the average of the rectified voltage signal by the average of the inductor current.

25 Claims, 8 Drawing Sheets

SYSTEM AND METHOD FOR MEASURING POWER IN A POWER FACTOR CONVERTER

TECHNICAL FIELD

The present disclosure relates generally to an electronic device, and more particularly to a system and method for measuring power in a power factor converter.

BACKGROUND

Power supply systems are pervasive in many electronic applications from computers to automobiles. Generally, voltages within a power supply system are generated by performing a DC-DC, DC-AC, and/or AC-DC conversion by operating a switch loaded with an inductor or transformer. One class of such systems includes switched mode power supplies (SMPS). An SMPS is usually more efficient than other types of power conversion systems because power conversion is performed by controlled charging and discharging of the inductor or transformer and reduces energy lost due to power dissipation caused by resistive voltage drops.

One specific application of an SMPS is the conversion of an AC line voltage to a DC voltage. An example of such a system includes number of stages including a rectifying stage, a power factor converter (PFC) and a DC-DC converter. The rectifying stage, which may be implemented using a diode bridge, converts the AC line voltage into a unipolar rectified signal. The PFC produces intermediate DC voltage from the unipolar rectified signal, and the DC-DC converter produces a second DC output voltage, for example 12 V. The power factor converter may be further configured to ensure that the input current of the SMPS is in phase with the input voltage in order to minimize reactive power.

SUMMARY OF THE INVENTION

In accordance with an embodiment, a method of measuring an input power of a power factor converter (PFC) includes determining an average of a rectified voltage signal from an input of the PFC, determining an average of an inductor current of the PFC, and determining the input power by multiplying the average of the rectified voltage signal by the average inductor current.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for measuring power in a switched-mode power factor corrector. Embodiments of the present invention may also be applied to various systems that utilize power measurements, such a power transmission systems and other types of switched-mode power supplies.

In embodiments of the present invention, real power consumed by a power supply is measured by monitoring a rectified input voltage of a power factor corrector and a further variable pertaining current flowing within the power factor corrector. This current related variable may be an average current flowing through an inductor or may be related to the timing of a pulse-width modulator used within the power factor corrector. In some embodiments, this rectified input voltage and the current related variable are sampled with relatively inexpensive analog to digital converters using a relatively low sample rate.

Some embodiment power factor correctors may be targeted for low cost consumer electronics market in which power metering features are used and where performance, efficiency, size and a low cost bill of materials (BOM) are a high priority. In some embodiments an accurate power measurement may be accomplished using a low cost digital power control integrated circuit that obtains, for example ±3% power measurement accuracy for input power above 30 W.

Figure 1:
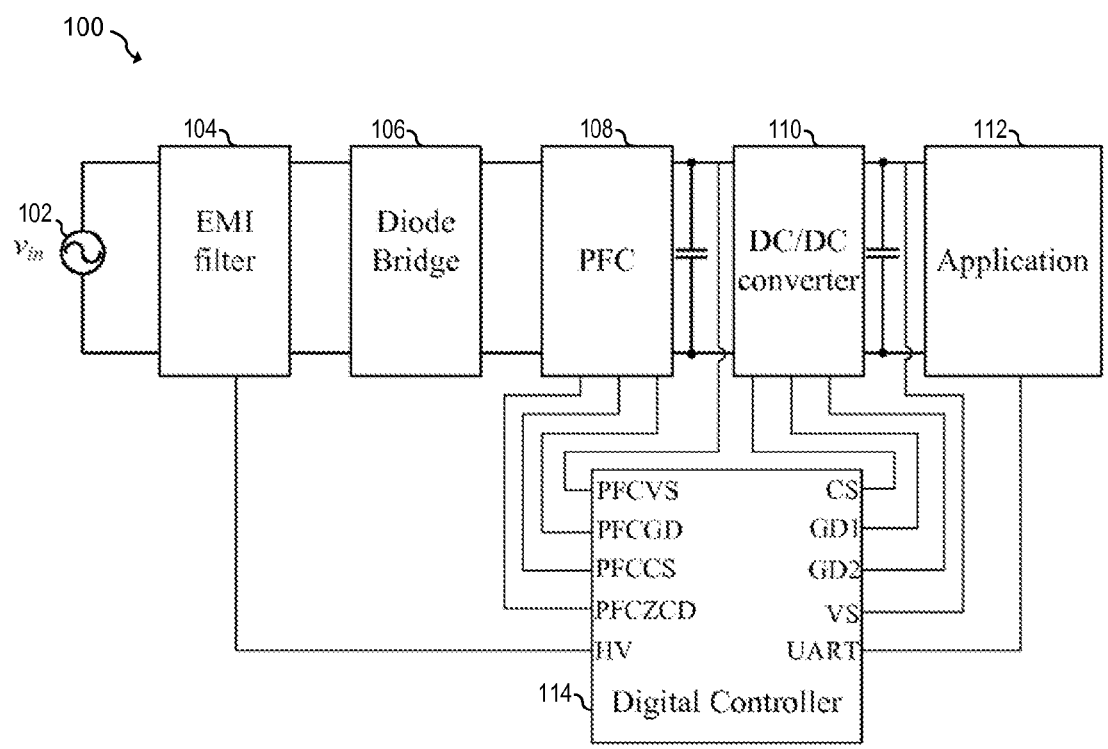
FIG. 1 illustrates a schematic of an embodiment power supply system.

FIG. 1 illustrates an embodiment AC/DC switched mode power supply system (SMPS) 100 that includes EMI filter 104, diode bridge 106, power factor corrector (PFC) 108, DC/DC converter and a load circuit represented by application 112. In an embodiment, power supply system 100 converts an AC signal represented by voltage source 102 into a DC voltage usable by application 112. EMI filter 104 filters out high frequency components, such as voltage spikes that may be present at the input of voltage source 102, and diode bridge 106 rectifies the input voltage to produce a rectified voltage. PFC 108 converts the rectified voltage to a DC voltage usable by DC/DC converter 110. Digital controller 114 monitors various voltages and currents within PFC 108 and DC/DC converter 110 and generates switching signals usable by these power conversion stages. In some embodiments, PFC 108 is implemented using a boost power factor corrector PFC that can operate in discontinuous conduction mode (DCM), critical conduction mode (CrCM) or quasi-resonant conduction mode (QRCM). Second stage DC/DC converter 110 may be implemented, for example, using a flyback, forward, or LLC converter. Alternatively, other power supply architectures known in the art may be used for PFC 108 and DC/DC converter 110.

In an embodiment, digital controller 114 implements a power metering algorithm that estimates the active input power consumption by the PFC 108, DC/DC converter 110 and the load represented by application 112. In some embodiments, the power metering algorithm uses available sensed signals or control parameters without additional sensing requirements. The power information may be sent to the main microcontroller unit (MCU) of application 112 via the Universal Asynchronous Receiver/Transmitter (UART) pin. In alternative embodiments, other digital interface types may be used besides a UART interface. For example, a digital interface for digital controller 114 may be implemented using a parallel digital interface and/or a series digital interface such as an SPI, IIC or other serial interface standard.

In conventional systems, an accurate AC power measurement may be performed by the direct computation of the RMS input power. For example, a rectified input voltage $v_g$ may be measured via an auxiliary bridge rectifier and a resistor divider and rectified input current $i_g$ may be measured via the current return path through a sense resistor. The rectified input voltage and rectified input current are measured using two first order sigma-delta ADCs having, for example, a sampling frequency of 1.6 MHz. The RMS input voltage and the RMS input current values are computed at the end of each AC half cycle by integrating the respective instantaneous values over each AC half cycle. Typically, RMS input voltage and RMS input current can be computed by $$V_{g,rms} = \sqrt{\frac{1}{t_2 - t_1} \int_{t_1}^{t_2} v_g(t)^2 \, dt}$$

$$I_{g,rms} = \sqrt{\frac{1}{t_2 - t_1} \int_{t_1}^{t_2} i_g(t)^2 \, dt}$$

where the AC half cycle period, $t_2-t_1$, is measured as the time interval between two zero crossings of the input voltage waveform. The input power is computed at the end of each AC half cycle and is given by $P_{in} = V_{g,rms} \times I_{g,rms}$. The RMS input voltage, the RMS input current and the input power may be accumulated for a configurable number of AC full line cycles. Next, these accumulated values are then averaged over the selected number of AC full line cycles to get the average RMS input voltage, the average RMS input current and the average input power. It should be noted that the computation of the RMS input power utilizes square root operations that may be computationally expensive.

Figure 2:
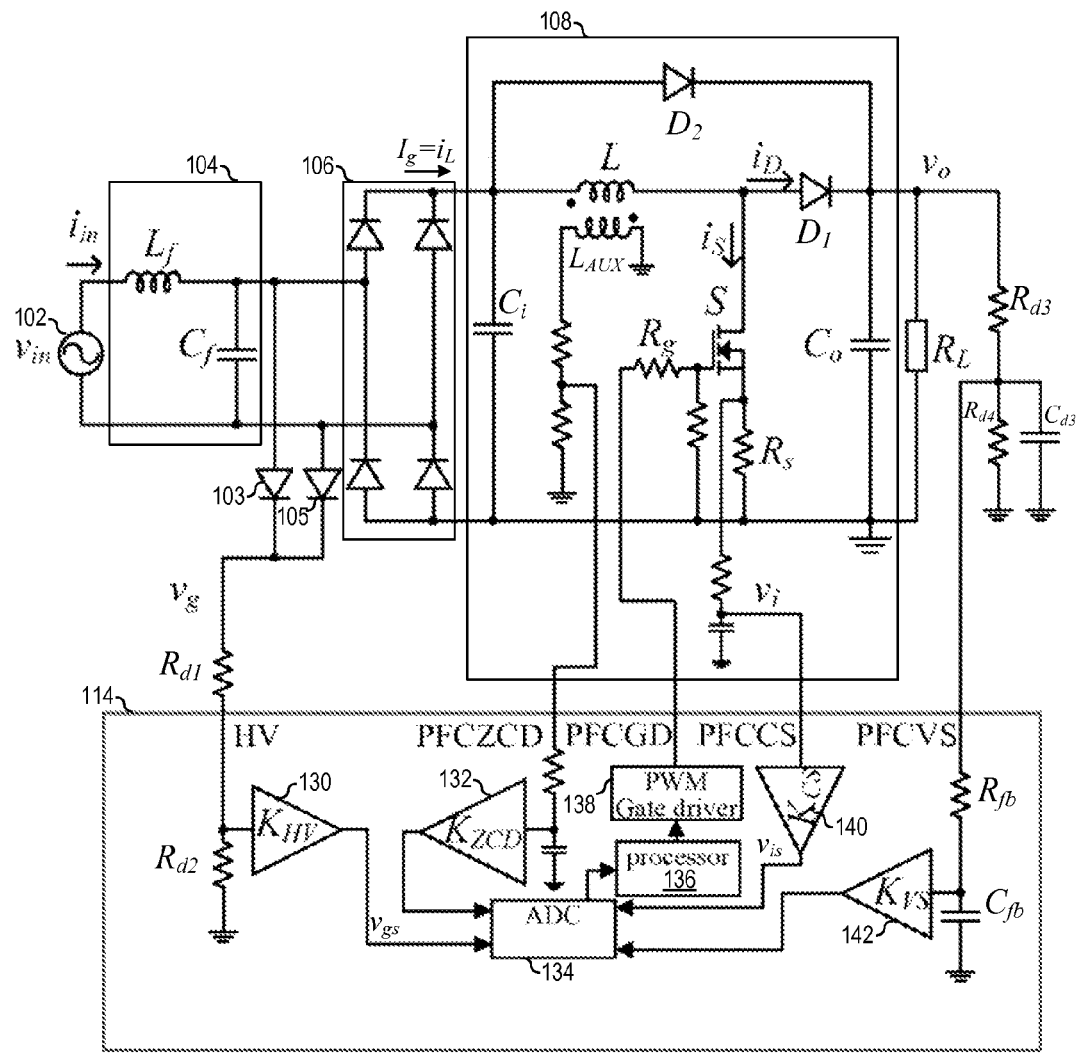
FIG. 2 illustrates a schematic of an embodiment PFC controller.

FIG. 2 illustrates PFC controller 200 according to an embodiment of the present invention that show various circuit level details of EMI filter 104, diode bridge 106, PFC 108 and digital controller 114, as well as other various passive components. As shown, EMI filter 104 is configured as a LC low pass filter that includes inductor $L_f$ and capacitor $C_f$. EMI filter 104 may be configured, for example, to reject high frequency components of the input power signal. Diode bridge 106 is implemented using a bridge circuit of four diodes. Further rectifying diodes 103 and 105 may be used to generate rectified input voltage $v_g$ for used by digital controller 114. PFC 108 is shown configured as a boost PFC and includes series inductor L, output rectifying diode $D_1$, switching transistor S, output filtering capacitor $C_0$, and series resistor $R_s$ coupled in series with the source of switching transistor S. Switching transistor S may be implemented using a MOSFET or other active device. In an embodiment, the voltage across series resistor $R_s$ is filtered to provide voltage $v_i$ for use by digital controller 114 to determine the current flowing through series inductor L. In embodiments that operate in the quasi-resonant (QR) mode of operation, auxiliary inductor $L_{AUX}$ is magnetically coupled to series inductor L in order to provide zero crossing detection for valley switching. Diode $D_2$ is coupled between the input and output of PFC 108 in order to couple the rectified input voltage to output node $v_o$ in case the output voltage drops lower than the input voltage, for example, during startup of PFC controller 200.

The load of PFC 108 is modeled as resistor $R_L$, and a voltage feedback path from output node $v_o$ to digital controller 114 is formed using a filtered resistor divider that includes resistors $R_{d3}$, and $R_{d4}$ and $C_{d3}$. This feedback voltage is further filtered using a lowpass filter made of resistor R and capacitor C within digital controller 114. Amplifier 142 scales the feedback voltage with a gain of $K_{VS}$. In alternative embodiments, one or more of these lowpass filter components and/or amplifier 142 may be situated external to digital controller 114. It should be understood that the schematic of PFC controller 200 is just one example of many possible embodiment switched mode power supplies. In alternative embodiments, other power supply architectures and interface circuitry could be used.

In an embodiment, digital controller 114 includes generates a pulse-width modulated switch signal at pin PFCGD based on output voltage $v_o$ feedback measured at pin PFCVS, valley detection feedback measured at pin PFC-ZCD, rectified input voltage $v_g$ measured at pin HV. As shown, the pulse-width modulated switch signal is generated using processor 136 buffered by PWM gate driver 138. The various analog input signals are buffered by amplifiers 130, 132, 140 and 142 and converted to the digital domain using analog-to-digital converter 134. In an embodiment, digital controller 114 is implemented on a single integrated circuit. Alternatively, digital controller 114 may be partitioned using one or more integrated circuits and various external discrete components.

During operation, rectified input voltage $v_g$ is measured at the HV pin of digital controller 114 using a resistive voltage divider having a divider ratio $K_{vg}$ that includes external resistor $R_{d1}$, and internal shunt resistor $R_{d2}$. Divider ratio $K_{vg}$ to steps down the input voltage to the input voltage range of HV pin. Amplifier 130 having a gain $K_{HV}$ that scales the input voltage to the input range of the ADC, such that the magnitude of the sensed input voltage at the ADC is given by $v_{gs} = K_{HV} K_{vg} v_g = K_v v_g$. In an embodiment, the input voltage is sampled at a sampling frequency of in kHz range. In some embodiments, one or both of resistors $R_{d1}$ and $R_{d2}$ may be disposed on a same integrated circuit as the remaining components depicted as being a part of digital controller 114. Alternatively, resistors $R_{d1}$ and $R_{d2}$ and/or amplifier 130 may be implemented as external components.

In an embodiment, the average rectified input current $i_g$ is equivalent to the average rectified inductor current $i_{L,ave}$ in a boost PFC. The inductor current $i_L$ passes through the switching transistor S during turn-on period of the switching transistor and passes through diode $D_1$ during the turn-off period of the switching transistor. Therefore, the current $i_S$ flowing through switching transistor S is equivalent to the rectified input current $i_g$ during the turn-on period of the MOSFET. The equivalent voltage $v_i$ with $i_S$ passing through an external sense resistor $R_s$ is sensed using the PFCCS pin of digital controller 114. Amplifier 140 has gain $K_{CS}$ that scales the equivalent voltage $v_i$ to the input range of the ADC, such that the magnitude of the sensed equivalent voltage $v_{is}$ representing the sensed input current at the ADC is given by $v_{is}=K_{CS}R_s i_s=K_{CS}R_s i_g$. The input current is sampled at a sampling frequency of $f_{s,vin}$ in kHz range.

Figure 3:
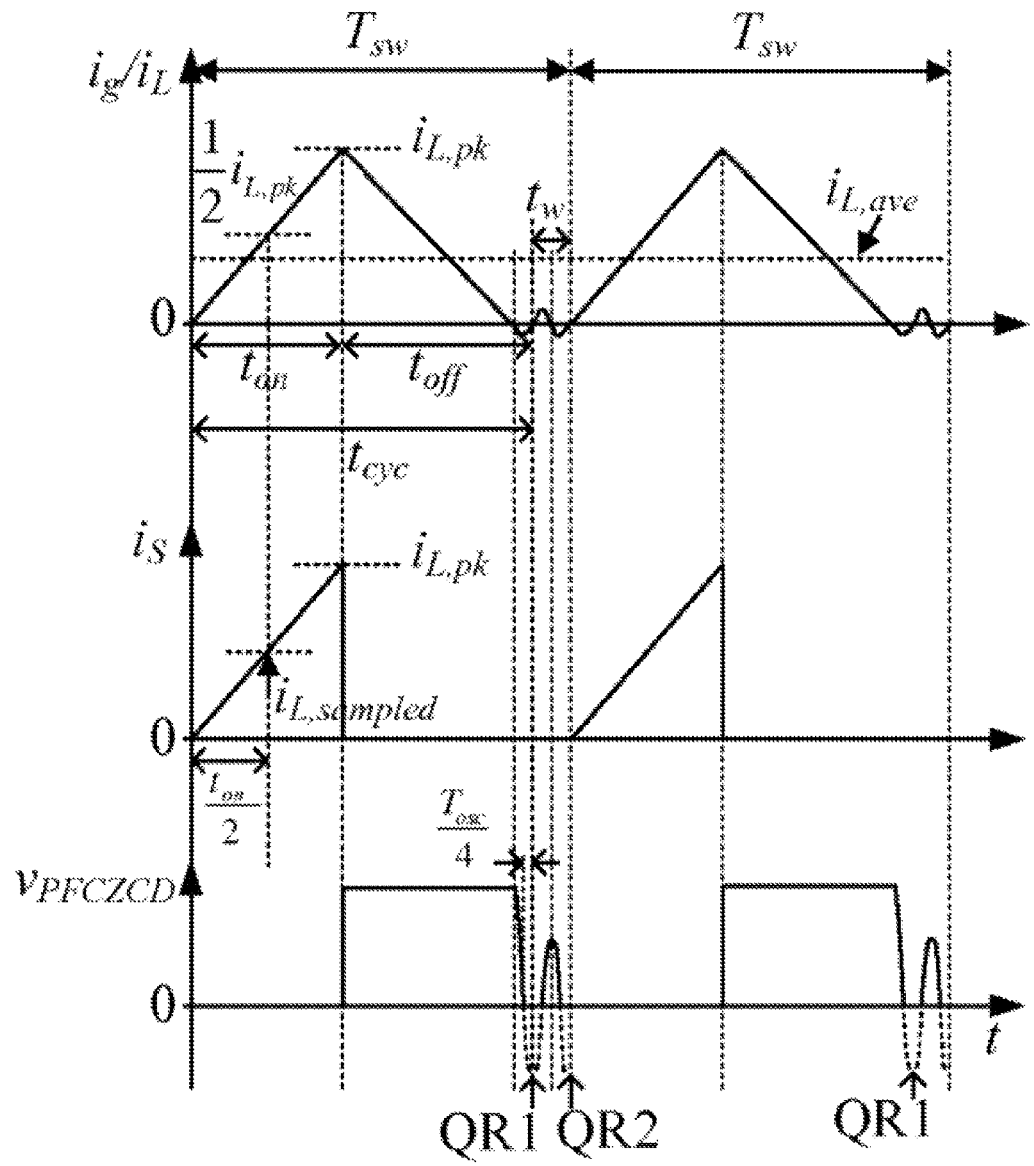
FIG. 3 illustrates a waveform diagram of an embodiment PFC system.

FIG. 3 illustrates a waveform diagram showing the operation of PFC controller 200 of FIG. 2 in a quasi-resonant operation mode. As shown, the waveform diagram includes plots of inductor current $i_L$, current $i_S$ through switching transistor S, and the voltage $v_{PFCZCD}$ at pin PFCZCD. In an embodiment, the inductor current $i_L$ is sampled in the middle of the turn-on time $t_{on}$ of switching transistor S at a sampling frequency of $f_{s,vin}$. This gives the average inductor current $i_{L,ave}$ during a switching period in CCM and CrCM operations. However, it does not give the average inductor current $i_{L,ave}$ during a switching period in DCM and QRCM operations. In these scenarios, sampling in the middle of the turn-on time ton of switching transistor S gives a value that is higher than the average inductor current $i_{L,ave}$.

According to some embodiments, to obtain the average inductor current from the sampled inductor current in DCM and QRCM operations, the sampled inductor current value is compensated as follows $$i_g = i_{L,ave} = \frac{1}{2} i_{L,pk} \frac{t_{cyc}}{T_{sw}} = i_{L,sampled} \frac{t_{cyc}}{T_{sw}} \quad (1)$$

where $i_{L,sampled}$ is the inductor current sampled in the middle of the turn-on time $t_{on}$ of switching transistor S, $t_{cyc}$ is the time between the start of gate on and when the first valley is detected at the PFCZCD pin plus a wait time of $T_{osc}/4$, and $T_{SW}$ is the switching period. $T_{osc}$ is the resonance period of the oscillation due to the parasitic MOSFET capacitor and inductance L. Alternatively, in the event that the $t_{cyc}$ timing measurement is not measurable or stable, $$\frac{t_{cyc}}{T_{sw}}$$

may be computed in order to obtain the average inductor current. The peak inductor current is given by $$i_{L,pk} = \frac{v_g t_{on}}{L} = \frac{(v_o - v_g) t_{off}}{L} \quad (2)$$

Rearranging the equation, $$\frac{t_{cyc}}{T_{sw}} = \frac{t_{on}}{T_{sw}} \frac{v_o}{v_o - v_g}. \quad (3)$$

Accordingly, $$i_{L,ave} = i_{L,sampled} \frac{t_{on}}{T_{sw}} \frac{v_o}{v_o - v_g}.$$

In some embodiments, the sampled values of the PFC output voltage $v_o$ and rectified AC input voltage $v_g$ are typically scaled down by different resistor divider ratios of $K_{vo}$ and $K_{vg}$ respectively. The sampled values of $v_o$ and $v_g$ are given by $K_{vo}v_o$ and $K_{vg}v_g$ respectively. Accordingly, $v_o$ and $v_g$ are scaled down with the same gain in order for the above equation (3) to be applied directly. Therefore, equation (3) is modified as shown in (4) to be applicable for the case with different resistor divider ratios for output voltage and input voltage sensing as follows:

$$\frac{t_{cyc}}{T_{sw}} = \frac{t_{on}}{T_{sw}} \frac{K_{vo}v_o}{K_{vo}v_o - \frac{K_{vo}}{K_{vg}}K_{vg}v_g} \quad (4)$$

Equation (3) and (4) assume that the same ADC resolution are used for $v_o$ and $v_g$. Thus, if $v_o$ is sensed using a different ADC resolution, it must be converted to the same ADC resolution as $v_g$.

In an embodiment, RMS input voltage and RMS input current are not obtained directly via high resolution voltage and current sensing and computationally intensive RMS calculation. The RMS input voltage and RMS input current are indirectly obtained via the average DC values of the sensed rectified sinusoidal input voltage and current measurements. This helps to simplify the RMS computation.

The Fourier series of a rectified sinusoidal waveform $f(t)=|V_m \sin(\omega t)|$ is $$f(t) = \frac{2V_m}{\pi} - \frac{4V_m}{\pi}\left[\frac{1}{3}\cos(2\omega t) + \frac{1}{15}\cos(4\omega t) + \frac{1}{35}\cos(6\omega t) + \ldots\right]. \quad (5)$$

To get the equivalent DC values from the average rectified input voltage and average rectified input current waveforms, a digital low pass filter is used to remove the frequency components at twice the line frequency and higher order frequency components. The DC value of the sensed rectified input voltage waveform $v_g$ is given by $$V_{g,dc} = \frac{2K_v V_{g,pk}}{\pi} = \frac{2\sqrt{2}}{\pi} K_v V_{g,rms}. \quad (6)$$

The DC value of the compensated equivalent voltage $v_{is}$ representing the average rectified input current waveform across a sense resistor is given by $$V_{Ig,dc} = \frac{2K_{CS} R_s I_{g,pk}}{\pi} = \frac{2\sqrt{2}}{\pi} K_{CS} R_s I_{g,rms} \quad (7)$$

Both $V_{g,dc}$ and $V_{Ig,dc}$ may be computed using digital low pass filters and are accumulated at every $f_{s,vin}$. The accumulated results are averaged at every $f_{s,vinacc}$ in several hundred Hz range to further reduce ripples at twice the line frequency in the low pass filter output. Other data accumulation and averaging schemes may also be used in other embodiments.

Figure 4:
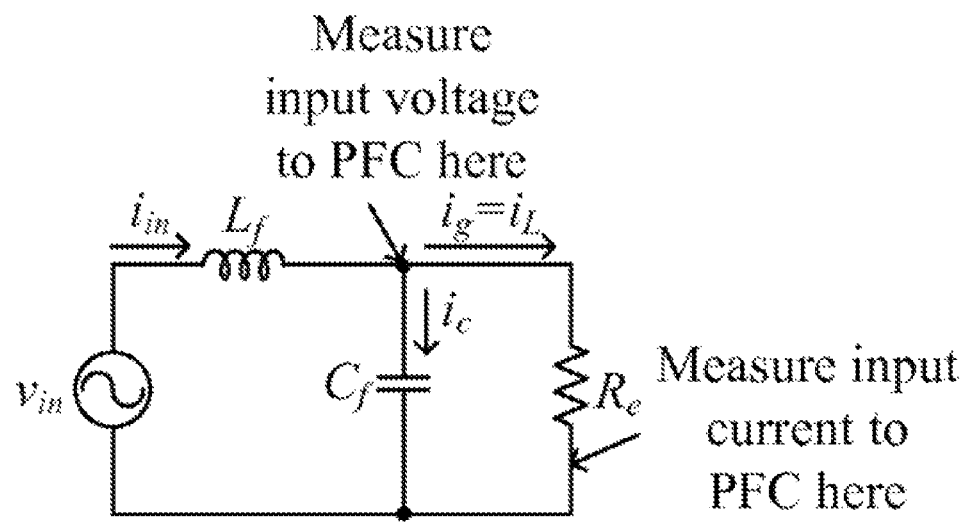
FIG. 4 illustrates a schematic and phasor diagram describing the operation of an embodiment power measurement system.
Figure 4:
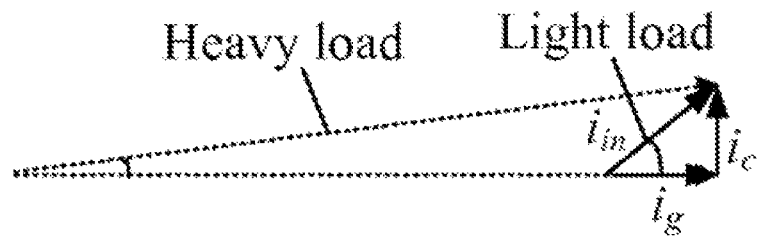

In power supplies having a PFC first stage, the PFC emulates a resistive load to the AC input so that the input current tracks the input voltage in phase and wave shape. Thus, the active current flows into the PFC while the reactive current flow through the EMI filter. The schematic diagram of FIG. 4 illustrates an example of this scenario in which current $i_g = i_L$ represents the active current and current $i_c$ represents the reactive current. Since the current flowing within the PFC circuit and the voltage at the input of the PFC are measured, the active power flowing into the PFC is estimated as illustrated in the phasor diagram of FIG. 4. The phase shift between the input voltage and input current is primarily caused by the EMI filter capacitance. Thus, the phase shift does not influence the power estimation in the PFC. Moreover, in some embodiments, distortion produces causing higher order harmonics are filtered out by the low pass filter and will not influence the power estimation in the PFC.

In an embodiments, multiplying the DC values of the rectified input voltage sinusoidal waveform and the compensated voltage representation of the average rectified input current sinusoidal waveform gives $$V_{g,dc} \times V_{Ig,dc} = \frac{2\sqrt{2}}{\pi} K_v V_{g,rms} \times \frac{2\sqrt{2}}{\pi} K_{CS} R_s I_{g,rms} = \frac{8}{\pi^2} K_v K_{CS} R_s (V_{g,rms} \times I_{g,rms}). \quad (8)$$

Accordingly, the input power can be obtained by $$P_{in} = V_{g,rms} \times I_{g,rms} = \frac{\pi^2}{8 K_v K_{CS} R_s} (V_{g,dc} \times V_{Ig,dc}). \quad (9)$$

In an embodiment, the accuracy of this method is dependent on ADC resolution and computational resolution. In some cases, the accuracy of the input power estimation may be improved through system calibration, which can help to compensate for any unaccounted nonlinearities, component tolerances and inaccuracy in input voltage measurement. For system calibration, the actual input power is measured using a reference power meter for a selected input voltage range and power range. The measured input power values are then compared with respect to the estimated input power values. A curve fitting approach using a mapping function method, such as a piecewise linear curve fitting, may be used to map the estimated input power values closer to the measured input power values. Using such a technique, the gain of the linear curve reflects a difference in gain from $$\frac{\pi^2}{8 K_v K_{CS} R_s}$$

in (9) and may be used to as a correction factor to compensate for component tolerances. Any unaccounted offset along the measurement path may be further taken into account by the offset of the piecewise linear curve.

Alternatively, in a further embodiment, the input power computation in equation (9) and system calibration may be combined into a single step in order to save a multiplication computation. For example, instead of computing the input power using equation (9), $V_{g,dc} \times V_{Ig,dc}$ can be computed instead. Hence, the actual input power is measured using a reference power meter for a selected input voltage range and power range and then the measured input power values are compared to the $V_{g,dc} \times V_{Ig,dc}$ values. A piecewise linear curve fitting approach are then used to map $C_{g,dc} \times V_{Ig,dc}$ values to the measured input power values. Accordingly, the gain of the linear curve is equivalent to $$\frac{\pi^2}{8 K_v K_{CS} R_s}$$

in equation (9). Any unaccounted offset along the measurement path can be taken into account by the offset of the piecewise linear curve.

An advantage of such an embodiment method is that the input power estimation is parameter independent, where there could be larger component tolerances, particularly with respect to inductance. A further advantage is that this method utilizes available sensed signals that are used for SMPS control without additional sensing requirements such as new sensing signals or high sampling frequency of the ADC. In addition, this method operates in various modes including CCM, CrCM, DCM and QRCM PFC. In CCM and CrCM, $$\frac{t_{cyc}}{T_{sw}} = 1$$

and the average input current value is given by sampling the inductor current in the middle of the MOSFET turn-on time as shown in (1). In DCM and QRCM, $$\frac{t_{cyc}}{T_{sw}} < 1$$

and the average inductor current value is given by equation (1). The RMS input voltage and RMS input current are indirectly obtained via the average DC values of the sensed rectified sinusoidal input voltage and current measurements. This helps to simplify the RMS computation as compared to conventional approach.

Figure 5:
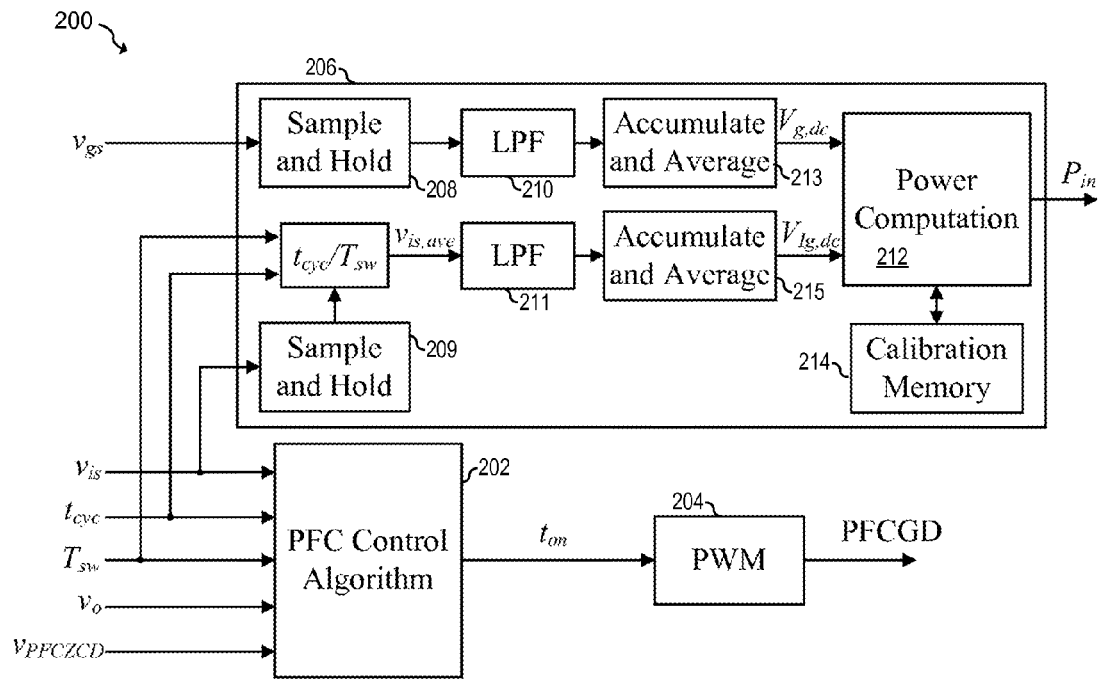
FIG. 5 illustrates an embodiment PFC controller that calculates power using average current and rectified voltage values.

FIG. 5 illustrates PFC controller 200 according to an embodiment that calculates power using average DC values of the rectified average current and rectified voltage values. As shown, PFC controller 200 includes power measurement system 206 and pulse-width modulator 204 that are coupled to a block that implements PFC control algorithm 202. The embodiment PFC controller 200 may be implemented, for example using analog and/or digital signal processing circuits and systems known in the art. Power measurement system 206 includes sample and hold blocks 208 and 209, lowpass filters 210 and 211, power computation block 212, and calibration memory 214. In an embodiment, sample and hold blocks 208 and 209 are used to sample the input voltage $v_{gs}$ and $v_{is}$ that is proportional the inductor current of the PFC. Voltage $v_{is}$ (see FIG. 2) is sampled at a midpoint of the inductor magnetization, at time $t_{on}/2$ as shown in FIG. 3 with respect to current $i_s$, the sampled value provides an indication of the average inductor value during CCM or CrCM operations. During DCM and QRCM, $v_{is}$ is compensated by $t_{cyc}/T_{sw}$ in block 217 to get a voltage equivalent of the rectified average inductor current value. In CCM and CrCM operations, $t_{cyc}/T_{sw}=1$ and the sampled value is not changed by the multiplication. The voltage equivalent of the rectified average inductor current value is passed through a low pass filter (LPF) 211 and an accumulate and average block 215 that produces average DC value $V_{Ig,dc}$. Lowpass filter 210, which may be implemented using a digital or analog filter, is used to lowpass filter the output of sample and hold block 210. The output of LPF 210 is then accumulated and averaged in block 213 to produce average DC value $V_{g,dc}$. Calibration memory 214 may be implemented using known memory circuits and systems such as, but not limited to SRAM, DRAM, ROM, EPROM and EEPROM. Calibration values stored in calibration memory 214 may be determined and implemented using embodiment calibration techniques described herein.

In an embodiment, PFC control algorithm 202 implements a switched-mode power supply control algorithm, which can include PFC control algorithms known in the art. As shown, PFC control algorithm determines a desired switch-on time $t_{on}$ to be used as an input to pulse-width modulator 204 in order to produce pulse signal PFCGD. In some embodiments, pulse signal PFCGD is buffered and used to drive a switch coupled to an inductor in the PFC. PFC control algorithm 202 may determine switch-on time $t_{on}$ based on the state of rectified input voltage signal Vgs, $v_{is}$ that is proportional the inductor current, and voltage feedback signal $v_o$, as well as zero crossing signal detection $V_{PFCZCD}$ used to detect valleys for quasi-resonant modes of operation.

In an embodiment, the rectified input voltage and current are sampled as described above. To obtain the average input/inductor current from the sampled inductor current in DCM and QRCM operations, the sampled inductor current value is compensated according to equations (1), (3) or (4).

In an embodiment, low pass filters are used to obtain the equivalent DC values from the average rectified input voltage and average rectified input current waveforms. Depending on the transient response requirement, a suitable low pass filter may be selected. If there is no fast update rate of power information required, a first order low pass filter may be used. If a fast update rate of power information is required, a two-stage low pass filter with two cascaded poles may be used.

The equivalent DC value of the average rectified input voltage $V_{g,dc}$ and the equivalent DC value of the average rectified input current $V_{Ig,dc}$ may be computed using digital low pass filters and accumulating the output of the digital filters at a sampling rate of $f_{s,vin}$ in kHz range. Sampling and accumulating in kHz range ensures that the sinusoidal waveform information is preserved and accurate. The accumulated results are averaged at every $f_{s,vinacc}$ in the range of several hundreds of Hz to further reduce ripple at twice the line frequency in the low pass filter output. Other data accumulation and averaging schemes may also be used.

The input power can be computed according to equation (9) if $V_{g,dc}$ and $V_{Ig,dc}$ are scaled absolute voltage values. For digital implementation with an ADC, there is an additional gain in (9) due to the ADC. If the ADC input voltage range is $v_{ADC}$ and it is a P-bit ADC, the DC values are both scaled by a gain of $$\frac{2^P - 1}{v_{ADC}}.$$

The additional gain in (9) due to the ADC is given by $$\left(\frac{v_{ADC}}{2^P - 1}\right)^2$$

and the power equation for digital implementation with digitally quantized values of $V_{g,dc}$ and $V_{Ig,dc}$ is $$P_{in} = V_{g,rms} \times I_{g,rms} = \frac{\pi^2}{8 K_v K_{CS} R_s}\left(\frac{v_{ADC}}{2^P - 1}\right)^2 (V_{g,dc} \times V_{Ig,dc}) \quad (10)$$

Let $$\frac{\pi^2}{8 K_v K_{CS} R_s}\left(\frac{v_{ADC}}{2^P - 1}\right)^2$$

in equation (10) be of Q16 format $$\left(\frac{\pi^2}{8 K_v K_{CS} R_s}\left(\frac{v_{ADC}}{2^P - 1}\right)^2 \times 2^{16}\right).$$

Accordingly, the computed $P_{in}$ is of the form XXXX YYYY H in hexadecimal. The upper word XXXX H is the integer part of the absolute value of $P_{in}$ and the lower word YYYY H divided by $2^{16}$ is the decimal part of the absolute value of $P_{in}$.

For example, in one embodiment, $P_{in}$=160 W, $V_{g,rms}$=230 VAC, $I_{g,rms}=P_{in}/V_{g,rms}$=0.69565 A, $K_v=K_{HV}$ $K_{vg}$=2× 2.4213×10$^{-3}$, $K_{CS}R_s$=4×0.08, $v_{ADC}$=2.4V, and an 8 bit ADC is used with P=8. The average DC value of the average rectified input voltage in digital form is given by $$V_{g,dc} = \frac{\frac{2\sqrt{2}}{\pi} K_v V_{g,rms}}{v_{ADC}} \times (2^P - 1) = 106d.$$

The average DC value of the average rectified input current in digital form is given by $$V_{Ig,dc} = \frac{\frac{2\sqrt{2}}{\pi} K_{CS} R_s I_{g,rms}}{v_{ADC}} \times (2^P - 1) = 21d.$$

The input power in digital form, $$\begin{aligned}P_{in} = V_{g,rms} \times I_{g,rms} &= \frac{\pi^2}{8 K_v K_{CS} R_s}\left(\frac{v_{ADC}}{2^P - 1}\right)^2 (V_{g,dc} \times V_{Ig,dc}) \\ &= 0.07052 \times (106d \times 21d) \\ &= \frac{4621d}{65536d} \times 2226d \\ &= \frac{10286346d}{65536d} = \frac{009C\ F50AH}{10000H} \\ &= 156 + \frac{62730d}{65536d} = 156.96W.\end{aligned}$$

In the above example, the power estimation error is $$\frac{160 - 156.96}{160} \times 100\% = 1.9\%.$$

Increasing resolution of computation can help in improving the accuracy. Limiting factors for accuracy in power estimation are ADC resolution and computation resolution.

The accuracy of the input power estimation may be improved through system calibration. For system calibration, the actual input power is measured using a reference power meter for a selected input voltage range and power range. The measured input power values are then compared with respect to the estimated input power values. A linear, quadratic or piecewise linear curve fitting approach can be used to map the estimated input power values closer to the measured input power values. However, a piecewise linear curve may be preferred in some embodiments because having different segments of linear curve may provide more flexibility in fitting the data closer and any differences can be easily related back to the linear equation in equation (10). Accordingly, the gain of the linear curve reflects a difference in gain from $$\frac{\pi^2}{8K_v K_{CS} R_s}\left(\frac{v_{ADC}}{2^P - 1}\right)^2$$

in equation (10) and may be used to compensate for component tolerances. Any unaccounted offset along the measurement path can be taken into account by the offset of the piecewise linear curve.

Alternatively, the input power computation in equation (10) and system calibration may be combined into a single step and save a multiplication computation. For example, instead of computing the input power in equation (10), $V_{g,dc} \times V_{Ig,dc}$ may be computed instead. The actual input power is measured using a reference power meter for a selected input voltage range and power range. The measured input power values are then compared with respect to $V_{g,dc} \times V_{Ig,dc}$ values. A linear, quadratic or piecewise linear curve fitting approach can be used to map $V_{g,dc} \times V_{Ig,dc}$ values to the measured input power values. However, a piecewise linear curve is preferred. The gain of the linear curve would be equivalent to $$\frac{\pi^2}{8K_v K_{CS} R_s}\left(\frac{v_{ADC}}{2^P - 1}\right)^2$$

in equation (10). Any unaccounted offset along the measurement path can be taken into account by the offset of the piecewise linear curve.

In accordance with a further embodiment, power estimation may be performed based on rectified sinusoidal input voltage and timing measurements. In such embodiments, the input current is not obtained directly via current measurement, but is indirectly obtained via the sensed rectified sinusoidal input voltage and timing measurements. This helps to eliminate an input current ADC conversion, which is not required for DCM, CrCM and QRCM PFC control and can free up the digital power IC resources for other tasks. In addition, this helps to reduce inaccuracies due to the lower resolution input current ADC conversion from the power estimation computation.

The average active power over a defined time period is given as $$P_{in} = \frac{1}{t_2 - t_1} \int_{t_1}^{t_2} v_g(t) i_g(t) dt \qquad (11)$$

where $v_g$ is the average rectified input voltage and $i_g$ is the average rectified input current. Substituting (2) into (1), the average input current in a switching cycle is $$i_g(t) = i_{L,ave}(t) = \frac{1}{2} i_{L,pk}(t) \frac{t_{cyc}(t)}{T_{sw}(t)} = \frac{1}{2L} v_g(t) t_{on}(t) \frac{t_{cyc}(t)}{T_{sw}(t)}. \qquad (12)$$

Therefore, the average active power is also given as $$P_{in} = \frac{1}{t_2 - t_1} \int_{t_1}^{t_2} \left(\frac{1}{2L} v_g^2(t) t_{on}(t) \frac{t_{cyc}(t)}{T_{sw}(t)}\right) dt = \qquad (13)$$

$$\frac{1}{2L} \frac{1}{t_2 - t_1} \int_{t_1}^{t_2} \left(v_g^2(t) t_{on}(t) \frac{t_{cyc}(t)}{T_{sw}(t)}\right) dt.$$

Alternatively, the average active power may be computed from $$P_{in} = \frac{1}{2L} \frac{1}{N} \sum_{i=1}^{N} v_{g,i}^2 t_{on,i} \frac{t_{cyc,i}}{T_{sw,i}} = \frac{1}{2LN} \sum_{i=1}^{N} v_{g,i}^2 t_{on,i} \frac{t_{cyc,i}}{T_{sw,i}} \qquad (14)$$

where N is the number of accumulated samples. In the event that $t_{cyc}$ timing measurement is not measurable or stable, $$\frac{t_{cyc}}{T_{sw}}$$

may be replaced by equation (3) or equation (4).

The accuracy of this method is dependent on computational resolution and tolerance of the inductance L. Therefore, in embodiments, N is set to be sufficiently large enough to cover as many AC half cycles as possible to ensure accuracy. The accuracy of the input power estimation may be improved through system calibration, which can help to compensate for any unaccounted nonlinearities, tolerance of the inductance and inaccuracy in input voltage measurement. For system calibration, the actual input power is measured using a reference power meter for a selected input voltage range and power range. The measured input power values are then compared with respect to the estimated input power values. A piecewise linear curve fitting approach may be used to map the estimated input power values closer to the measured input power values. Accordingly, the gain of the linear curve reflects a difference in gain from $$\frac{1}{2LN}$$

in equation (14) and may be used to compensate for the tolerance of the inductance. Any unaccounted offset along the measurement path may be further taken into account by the offset of the piecewise linear curve.

Figure 6:
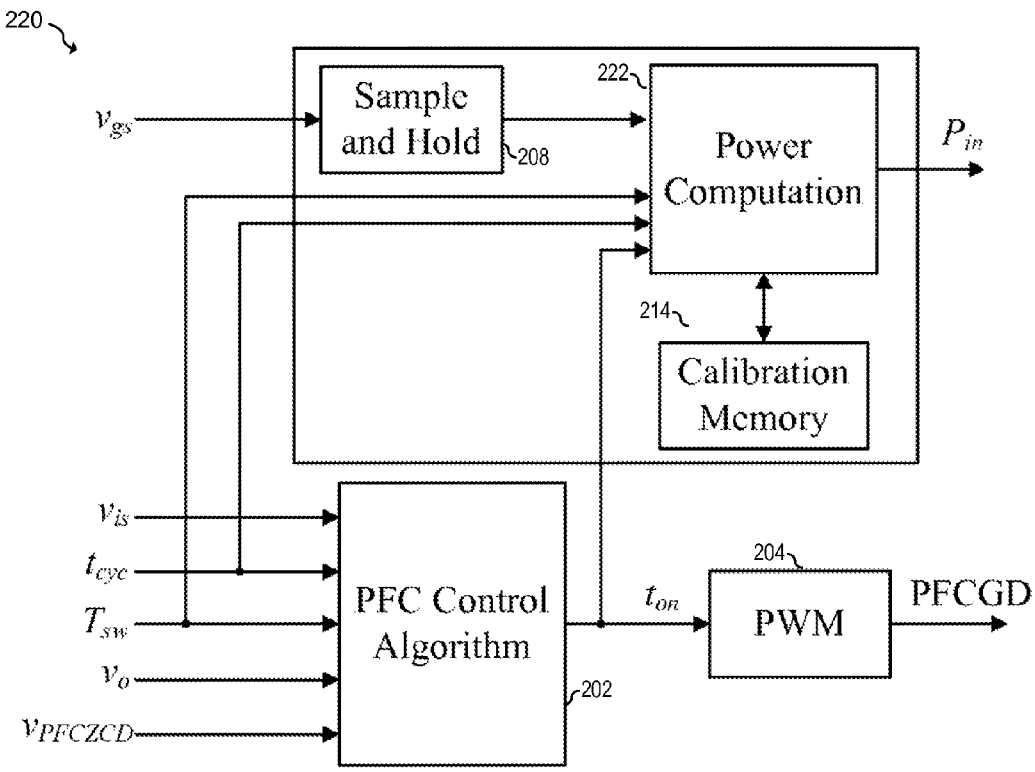
FIG. 6 illustrates an embodiment PFC controller that calculates power using rectified voltage values and a timing value.

FIG. 6 illustrates PFC controller 220 according to an embodiment that calculates power using rectified voltage values and $$t_{on} \frac{t_{cyc}}{T_{sw}}$$

as described above. As shown, power computation block 222 uses measured rectified voltage value Vgs and timing values $t_{on,i}$, $t_{cyc,i}$, and that are calculated or measured by PFC control algorithm 202.

Alternatively, the input power computation in equation (14) and system calibration can be combined into a single step and save a multiplication computation. Instead of computing the input power in equation (14), $$\sum_{i=1}^{N} v_{g,i}^2 t_{on,i} \frac{t_{cyc,i}}{T_{sw,i}}$$

can be computed instead. The actual input power is measured using a reference power meter for a selected input voltage range and power range. The measured input power values are then compared with respect to $$\sum_{i=1}^{N} v_{g,i}^2 t_{on,i} \frac{t_{cyc,i}}{T_{sw,i}}$$

values. A piecewise linear curve fitting approach may be used to map $$\sum_{i=1}^{N} v_{g,i}^2 t_{on,i} \frac{t_{cyc,i}}{T_{sw,i}}$$

values to the measured input power values. The gain of the linear curve would is equivalent to $$\frac{1}{2LN}$$

in equation (14). Any unaccounted offset along the measurement path can be taken into account by the offset of the piecewise linear curve.

The input power may be computed according to equation (14) if all the quantities are in unscaled absolute voltage and time values. For digital implementation with an ADC, there is an additional gain in equation (14) due to the ADC, sensing gain of the input voltage and clock period of the processor in the digital control IC. If the sensing gain of the input voltage is $K_v = K_{HV} K_{vg}$, the ADC input voltage range is $v_{ADC}$ and it is a P-bit ADC, the digitally quantized value of $v_{g,i}^2$ is scaled by a gain of $$\left( K_{HV} K_{vg} \frac{2^P - 1}{v_{ADC}} \right)^2.$$

If the clock period of the processor is $T_{clk}$, the digitally quantized values of $t_{on,i}$, $t_{cyc,i}$ and $T_{sw,i}$ are scaled by a gain of $1/T_{clk}$. Therefore, to compute power based on digitally quantized values of $v_{g,i}^2$, $t_{on,i}$, $t_{cyc,i}$ and $T_{sw,i}$ in equation (14), an additional gain of $$\frac{T_{clk}}{\left( K_{HV} K_{vg} \frac{2^P - 1}{v_{ADC}} \right)^2}$$

is to be multiplied in equation (14) in some embodiments. Accordingly, and the power equation for a digital implementation is $$P_{in} = \frac{T_{clk}}{\left( K_{HV} K_{vg} \frac{2^P - 1}{v_{ADC}} \right)^2} \frac{1}{2LN} \sum_{i=1}^{N} v_{g,i}^2 t_{on,i} \frac{t_{cyc,i}}{T_{sw,i}} \quad (15)$$

The gain $$\frac{T_{clk}}{\left( K_{HV} K_{vg} \frac{2^P - 1}{v_{ADC}} \right)^2} \frac{1}{2LN}$$

in equation (15) has a magnitude of the order of $10^{-8}$. In some embodiments, an appropriate quantization is performed to ensure a sufficient computational resolution to obtain $P_{in}$. In CrCM, $$\frac{t_{cyc,i}}{T_{sw,i}} = 1,$$

and $t_{on,i}$ may be measured by the power IC or computed by the PFC voltage controller. In DCM or QRCM where $$\frac{t_{cyc,i}}{T_{sw,i}} < 1,$$

$t_{cyc,i}$ and $T_{sw,i}$ may be measured by the power IC and $t_{on,i}$ can be measured by the power IC or computed by the PFC voltage controller. In the event that $t_{cyc}$ timing measurement is not measurable or stable, $$\frac{t_{cyc}}{T_{sw}}$$

may be replaced by equation (3) or equation (4).

In an embodiment, the product of $$v_{g,i}^2 t_{on,i} \frac{t_{cyc,i}}{T_{sw,i}}$$

is accumulated at a sampling frequency of $f_{s,vin}$ in kHz range for N samples. Sampling and accumulating in kHz range may ensure that the sinusoidal waveform information is preserved and accurate. In embodiments, N is set to be large enough large to cover as many AC half cycles as possible to ensure accuracy. The selection of N is dependent on the sampling frequency $f_{s,vin}$ and the computational resources available in the digital control platform. For example, in one embodiment with 16 bit registers and 32 bit arithmetic logic unit, N is set to 4096 if the sampling rate is 128 us and to 512 if the sampling rate is 1024 us.

The accuracy of this method is dependent on computational resolution and tolerance of the inductance L. The accuracy of the input power estimation may be improved through system calibration. For system calibration, the actual input power is measured using a reference power meter for a selected input voltage range and power range. The measured input power values are then compared with respect to the estimated input power values. A linear, quadratic or piecewise linear curve fitting approach can be used to map the estimated input power values closer to the measured input power values. However, a piecewise linear curve is preferred because having different segments of linear curve can give more flexibility in fitting the data closer and any differences can be easily related back to the linear equation in equation (15). The gain of the linear curve thus reflects a difference in gain from $$\frac{Tclk}{\left(K_{HV}K_{vg}\frac{2^P-1}{v_{ADC}}\right)^2}\frac{1}{2LN}$$

in equation (15) and may be used to compensate for component tolerances particularly that of the inductance. Any unaccounted offset along the measurement path can be taken into account by the offset of the piecewise linear curve.

Alternatively, the input power computation in equation (15) and system calibration may be combined into a single step and save a multiplication computation. Instead of computing the input power in equation (15), $$\sum_{i=1}^{N} v_{g,i}^2 t_{on,i} \frac{t_{cyc,i}}{T_{sw,i}}$$

can be computed instead. The actual input power is measured using a reference power meter for a selected input voltage range and power range. The measured input power values are then compared with respect to $$\sum_{i=1}^{N} v_{g,i}^2 t_{on,i} \frac{t_{cyc,i}}{T_{sw,i}}$$

values. A piecewise linear curve fitting approach can be used to map $$\sum_{i=1}^{N} v_{g,i}^2 t_{on,i} \frac{t_{cyc,i}}{T_{sw,i}}$$

values to the measured input power values. The gain of the linear curve would be equivalent to $$\frac{Tclk}{\left(K_{HV}K_{vg}\frac{2^P-1}{v_{ADC}}\right)^2}\frac{1}{2LN}$$

in equation (15). Any unaccounted offset along the measurement path can be taken into account by the offset of the piecewise linear curve.

In accordance with a further embodiment, the control signal that is used to get an optimized on-time $t_{on}$ for the pulse-width modulator 204 may be used to calculate the input power of the PFC. In some embodiments, the circuits and systems may be used as is disclosed in U.S. application Ser. No. 13/970,414, entitled, "Power Factor Correction Circuit and Method," which application is incorporated by reference herein in its entirety. In an embodiment, the output of the voltage controller is $$T_{CTL} = T_{onDesired} = t_{on}\frac{t_{cyc}}{T_{sw}} = \frac{t_{on}^2}{T_{sw}}\frac{v_o}{v_o - v_g} \quad (16)$$

Therefore, (13) becomes $$P_{in} = \frac{1}{2LN}\sum_{i=1}^{N} v_{g,i}^2 t_{on,i}\frac{t_{cyc,i}}{T_{sw,i}}\frac{1}{2LN}\sum_{i=1}^{N} v_{g,i}^2 T_{onDesired,i}. \quad (17)$$

In one example embodiment, an accuracy of ±3% can be achieved for an input power above 30 W at 110 VAC±10% and 230 VAC±10%. An advantage of such an embodiment is that it utilizes available sensed signals and control parameters that are used for SMPS control without additional sensing requirements such as new sensing signals or high sampling frequency of the ADC. This method can work with CrCM, DCM and QRCM PFC. The input current is indirectly obtained via the sensed rectified sinusoidal input voltage and timing measurements. This helps to save an input current ADC conversion, which, in some embodiments, is not required for DCM, CrCM and QRCM PFC control and can free up the digital power IC resources for other tasks. In addition, this helps to reduce inaccuracies due to the lower resolution input current ADC conversion from the power estimation computation.

Figure 7:
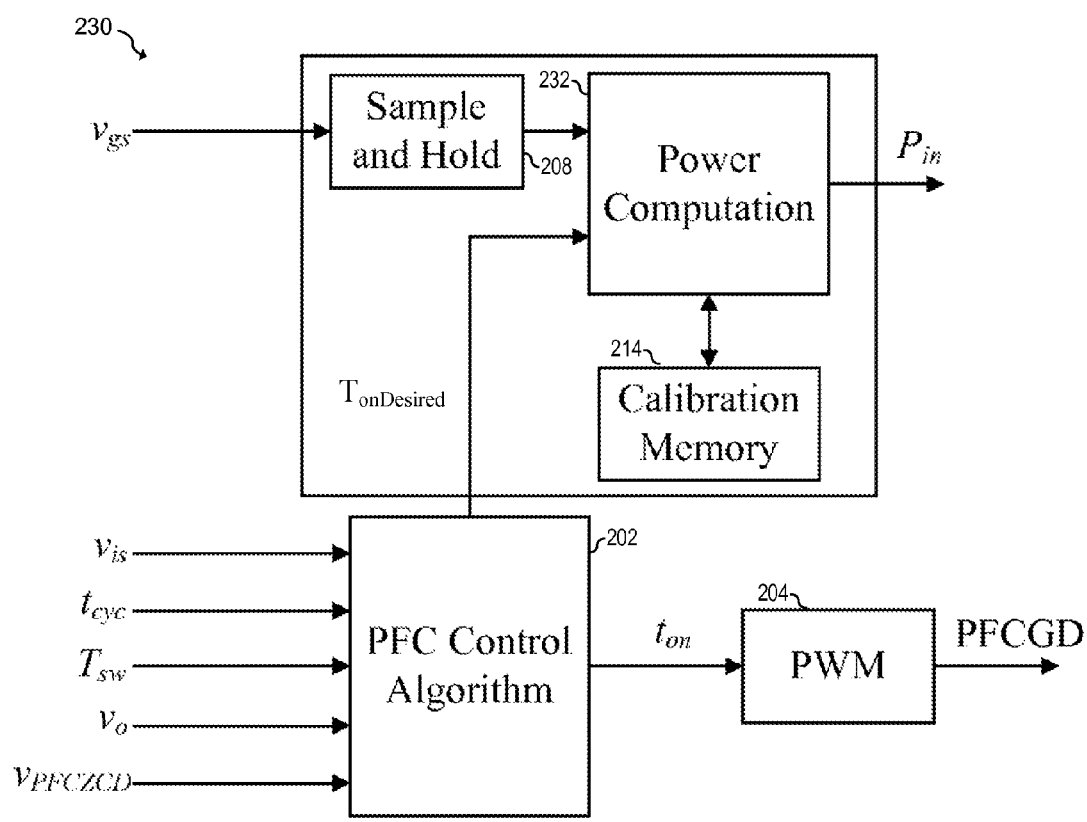
FIG. 7 illustrates a further embodiment PFC controller that calculates power using rectified voltage values and a timing value.

FIG. 7 illustrates embodiment PFC controller 230 that may be used to implement a PFC that calculates input power based on desired pulse-width $T_{onDesired}$. As shown, power computation block 232 uses rectified input signal Vgs and desired pulse-width $T_{onDesired}$ to obtain calculated input power $P_{in}$. In an embodiment, power computation block 232 calculates this input power according to equation (17).

In alternative embodiments of the present invention, the power computation may be performed in continuous time instead of discrete time with respect to the embodiments of FIGS. 5-7. For example, in the embodiment of FIG. 5, sample and hold blocks 206 and/or 209 may be omitted in continuous time embodiments that implement equation (9). Accordingly, low pass filters 210 and 211 may be implemented using continuous time filters using, for example, resistors and capacitors, and the accumulate and average blocks may be implemented using continuous time integrators. Continuous time circuitry may be used to implement power computation block 212. In another example, the embodiment of FIG. 6 may be modified by omitting sample and hold 208 and using continuous time calculation circuits to implement power computation block 222 in order to implement equation (13). In a further embodiment, the system of FIG. 7 may also be modified to omit sample and hold block 208 and use continuous time calculation circuits to implement power computation block 232. Such an embodiment could be used to implement a continuous time version of equation (17).

Figure 8:
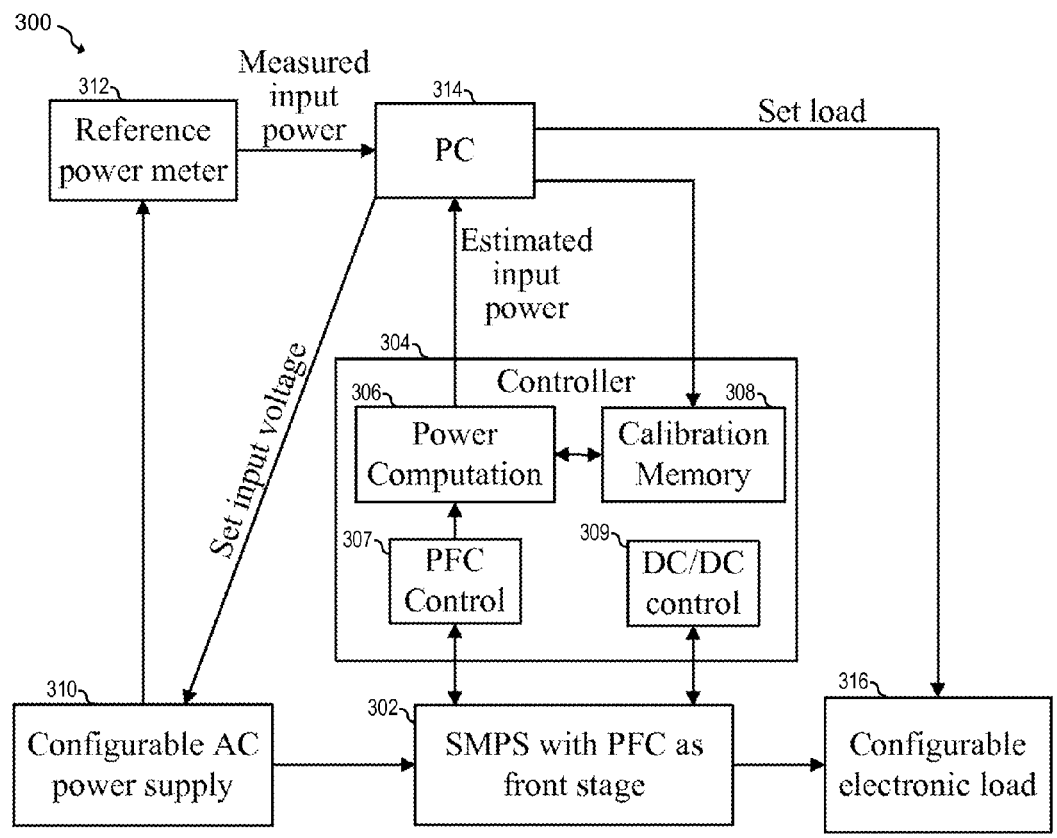
FIG. 8 illustrates an embodiment PFC controller calibration system.

FIG. 8 illustrates calibration test system 300 that may be used to implement system calibration for the various embodiments described above. As shown, calibration test system 300 includes an embodiment power supply system 302 having a PFC as a front stage, and an embodiment power supply controller 304 that includes power computation system 306 that implements one of the various embodiment power measurement methods described above, calibration memory 308, PFC control block 307 and DC/DC control block 309. During calibration, configurable AC power supply 310 supplies an AC signal to the power supply system 302 and power meter 312 is used to measure the amount of power being delivered to power supply system 302. In an embodiment, a personal computer (PC) 314 is used to control the configurable power supply 310, control a configurable electronic load 316 to get a desired input power, collect measurements from power meter 312, and write calibration memory 308. Alternatively, a microcontroller, manufacturing test system, or other digital control circuit known in the art may be used in place of PC 314. Based on these measurements, calibration values are written to calibration memory 308 in accordance with the various calibration methods discussed above.

Figure 9A:
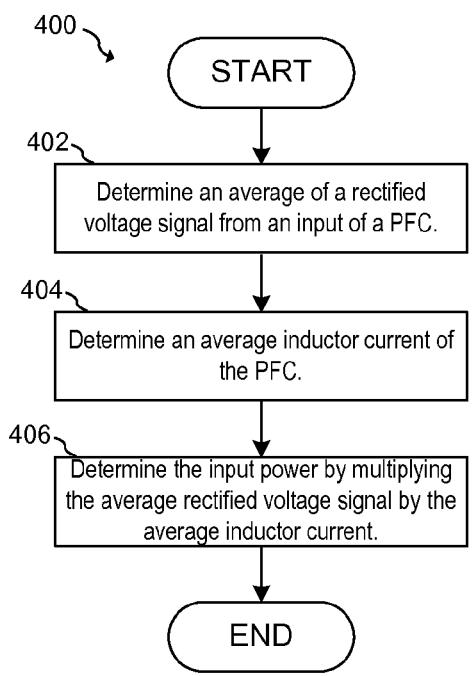
FIGS. 9a-9b illustrate flowcharts of embodiment methods.

FIG. 9a illustrates a flowchart 400 of an embodiment method of measuring an input power of a power factor converter (PFC). In step 402, an average of a rectified voltage is determined signal from an input of the PFC. Such an average value may be determined, for example, by lowpass filtering the rectified input voltage of the PFC. In step 404, an average of the inductor current of the PFC is determined. Such an average value may be determined, for example, by averaging or lowpass filtering a measurement of the inductor current. In some embodiments, this measurement of the inductor current may be determined by sampling the inductor current in the middle of a charging cycle. For example, the inductor current may be sampled at time $t_{on}/2$ as to obtain $i_{L,sampled}$ as shown in FIG. 3. To obtain the average input/inductor current from the sampled inductor current in DCM and QRCM operations, the sampled inductor current value is compensated according to equations (1), (3) or (4). In step 406, the input power is determined by multiplying the average of the rectified voltage signal by the average of the inductor current to form a first measured value. This calculation may be obtained, for example, by evaluating equation (9) above.

Figure 9B:
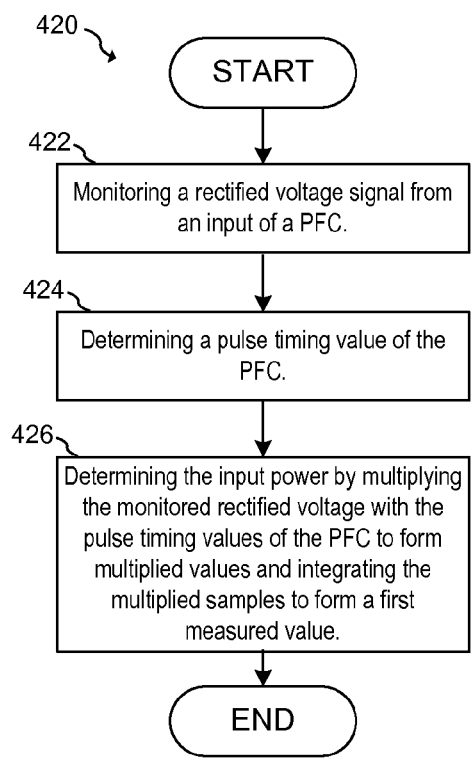

FIG. 9b illustrates a flowchart 420 of an embodiment method of measuring an input power of a power factor converter (PFC). In step 422, a rectified voltage is monitored from an input of the PFC. In some embodiments, the monitoring of the rectified voltage may entail sampling the rectified voltage to obtain sampled values. Such samples may be obtained, for example, using an analog-to-digital converter. In step 424, a pulse timing value of the PFC is determined. Such a pulse timing value may include, for example, $T_{onDesired}$ or $$t_{on} \frac{t_{cyc}}{T_{sw}}$$

as described above. In step 426, the input power to the PFC is determined by multiplying the monitored rectified voltage with the pulse timing values of the PFC to form multiplied values and integrating the multiplied samples to form a first measured value. In some embodiments, this is accomplished by multiplying the sampled values with the pulse timing value of the PFC to form multiplied samples and accumulating the multiplied samples to form the power measurement. Alternatively, the method 420 may be implemented using continuous time operations. In an embodiment, this power measurement may be determined using equations (14) or (17) as described above.

In an embodiment, power in a switched mode power supply is estimated using average DC values of the rectified sinusoidal input voltage and current measurements and a method of power estimation based on rectified sinusoidal input voltage and timing measurements. In some embodiments, DC values of the rectified sinusoidal input voltage and current are obtained using analog and/or digital low pass filters; DC values are accumulated and averaged to obtain average DC values, and active power is computed according to equation (9) using the average DC values. Here, the RMS input voltage and RMS input current are indirectly obtained via the average DC values of the sensed rectified sinusoidal input voltage and current measurements. Such an embodiment may, for example, simplify tedious RMS computations.

In a further embodiment, active power is computed according to equation (13) using input voltage and timing measurements. The input current is indirectly obtained via the sensed rectified sinusoidal input voltage and timing measurements to save an input current ADC conversion and reduce inaccuracy due to the lower resolution input current ADC conversion.

In accordance with various embodiments, circuits or systems may be configured to perform particular operations or actions by virtue of having hardware, software, firmware, or a combination of them installed on the system that in operation causes or cause the system to perform the actions. One general aspect includes a method of measuring an input power of a power factor converter (PFC). The method includes determining an average of a rectified voltage signal from an input of the PFC, determining an average of the inductor current of the PFC, and determining the input power by multiplying the average of the rectified voltage signal by the average of the inductor current to form a first measured value. Other embodiments of this aspect include corresponding circuits and systems configured to perform the various actions of the method.

Implementations may include one or more of the following features. The method where determining the average of the rectified voltage signal includes receiving a rectified input voltage from a rectifier coupled to the input of the PFC and filtering the received rectified input voltage. In some embodiments, the average of the inductor current of the PFC is also filtered. The method may further include converting the received rectified voltage signal into the digital domain to form a digitized rectified input voltage; and filtering the received rectified input voltage includes digitally filtering the digitized rectified input voltage. In an embodiment, determining the average of the inductor current of the PFC includes sampling an inductor current during a midpoint of a turn-on time of a switch coupled to an inductor of the PFC. Sampling the inductor current may include measuring a voltage across a resistor coupled in series with the switch coupled to the inductor of the PFC. In some embodiments, determining the input power further includes multiplying the first measured value by a first scaling factor to form a scaled measured value.

In an embodiment, the method further includes correcting the scaled measured value using a correction factor. The method may further include determining the correction factor including: providing a test signal to the PFC, measuring an input power of the PFC using a reference power meter to form a reference measurement, comparing the reference measurement to a scaled measure value, and determining the correction factor based on the comparing. Implementations may further include the method where determining the correction factor further includes sweeping an amplitude of the test signal over a plurality of amplitudes, and determining a plurality of correction factors corresponding to the plurality of amplitudes. Determining the input power further may also include mapping the multiplied value to a calibrated input power using a mapping function.

The method may further include determining the mapping function by providing a test signal to the PFC, measuring an input power of the PFC using a reference power meter to form a reference measurement, comparing the reference measurement to a scaled measure value, and determining the mapping function based on the comparing. In an embodiment, the mapping function includes a piecewise linear mapping function. The method may further include compensating the determined average inductor current according to $iL_{,sampled}$, $$\frac{t_{on}}{T_{sw}} \frac{v_o}{v_o - v_g},$$

wherein $i_{L,sampled}$ is an inductor current sampled in a middle of the turn-on time $t_{on}$ of a switch of the PFC, $T_{sw}$ is a switching period of the switch in the PFC $t_{cyc}$, $v_o$ is an output voltage of the PFC, and $v_g$ is the rectified voltage signal of the PFC.

A further general aspect includes a method of measuring an input power of a power factor converter (PFC). The method may include monitoring a rectified voltage signal from an input of the PFC, determining a pulse timing value of the PFC, and determining the input power by multiplying the monitored rectified voltage with the pulse timing value of the PFC to form multiplied values and integrating the multiplied samples to form a first measured value. Other embodiments of this aspect include corresponding circuits and systems configured to perform the various actions of the methods.

Implementations may include one or more of the following features. The method where the monitoring the rectified voltage signal from an input of the PFC includes sampling a rectified voltage signal from an input of the PFC to obtain sampled values, the multiplying the monitored rectified voltage signal with the pulse timing value of the PFC to form multiplied values includes multiplying the sampled values with the pulse timing value of the PFC to form multiplied samples, and the integrating the multiplied samples to form the first measured value includes accumulating the multiplied samples to form the first measured value. In an embodiment, the input power is determined by multiplying the sampled values with the pulse timing value of the PFC to form multiplied samples and accumulating the multiplied samples to form a first measured value.

Implementations may include the method where the pulse timing value is determined according to:

$$t_{on} \frac{t_{cyc}}{T_{sw}},$$

where $t_{on}$ is an on-time of a switch in the PFC, $t_{cyc}$ is a time during which current flows in an inductor of the PFC, and $T_{sw}$ is a switching period of the switch in the PFC. In some embodiments, the pulse timing value is obtained from an input signal of a pulse-width modulator of the PFC. Determining the input power may further include multiplying the first measured value by a first scaling factor to form a scaled measured value. The method may further include the scaled measured value using a correction factor.

In an embodiment, the method further includes determining the correction factor by providing a test signal to the PFC, measuring an input power of the PFC using a reference power meter to form a reference measurement, comparing the reference measurement to a scaled measure value, and determining the correction factor based on the comparing. Determining the correction factor may further include sweeping an amplitude of the test signal over a plurality of amplitudes and determining a plurality of correction factors corresponding to the plurality of amplitudes.

In an embodiment, determining the input power further includes mapping the multiplied value to a calibrated input power using a mapping function. Determining the mapping function may include providing a test signal to the PFC, measuring an input power of the PFC using a reference power meter to form a reference measurement, comparing the reference measurement to a scaled measure value; and determining the mapping function based on the comparing. The mapping function may include a piecewise linear mapping function. A further general aspect includes a power supply controller having a first interface configured to be coupled to a rectified input voltage of a power factor converter (PFC) and a pulse-width modulator having an output at a second interface configured to activate a switching transistor of the PFC, where the power supply controller is configured to sample the rectified input voltage to obtain sampled values, determine a pulse timing value, and determine an input power by multiplying the sampled values with the pulse timing value to form multiplied samples and accumulating the multiplied samples to form a first measured value. Other embodiments of this aspect include corresponding circuits and systems configured to perform the various actions of the methods.

Implementations may include one or more of the following features. The power supply controller where the pulse timing value is determined according to:

$$t_{on} \frac{t_{cyc}}{T_{sw}},$$

where $t_{on}$ is an on-time of a switch in the PFC, $t_{cyc}$ is a time during which current flows in an inductor of the PFC, and $T_{sw}$ is a switching period of the switch in the PFC. The power supply controller where the pulse timing value is obtained from an input signal of a pulse-width modulator of the PFC.

In an embodiment, the controller is further configured to determine the input power by multiplying the first measured value by a first scaling factor to form a scaled measured value. The controller may be further configured to correct the scaled measured value using a correction factor. Determining the input power may also include mapping the multiplied value to a calibrated input power using a mapping function. In some embodiments, this mapping function includes a piecewise linear mapping function.

In some embodiments, the power supply further includes an analog-to-digital converter having an input coupled to the first interface and/or may also include the PFC. Implementations of the described techniques may include hardware, a method or process, or computer software on a computer-accessible medium.

Advantages of some embodiments include the ability to perform an accurate real power measurement without the computational overhead of performing a square root function in the course of computing the RMS input power. A further advantage includes the ability to use lower resolution ADCs with lower sampling rates, thereby enabling lower power consumption, for example, compared to a directly calculated RMS measurement. A further advantage includes the ability of the power measurement circuitry and the digital PFC control circuitry to be integrated on a single integrated circuit.

Further advantages of embodiments include the ability to achieve high accuracy when system calibration is performed even with lower resolution ADCs and lower sampling rates. This allows power metering feature to be made available for low cost consumer electronics market where low cost and high performance are equally of high priority. In the low cost consumer market, it is difficult to implement high-end ADCs with high resolution and fast sampling rates because such ADCs are costly and have a high power consumption. Embodiments of the present invention can be easily integrated without additional sensing requirement but yet provide high accuracy.

In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media that is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. In addition, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. In addition, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of intraoperative hardware units, including one or more processors as described above, in conjunction with suitable software and/or firmware.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A method of measuring an input power of a power factor converter (PFC), the method comprising:
   determining an average of a rectified voltage signal from an input of the PFC;
   determining an average of an inductor current of the PFC; and
   determining the input power by multiplying the average of the rectified voltage signal by the average of the inductor current.

2. The method of claim 1, wherein determining the average of the rectified voltage signal comprises:
   receiving a rectified input voltage from a rectifier coupled to the input of the PFC; and
   filtering the received rectified input voltage.

3. The method of claim 2, wherein:
the method further comprises converting the received rectified voltage signal into the digital domain to form a digitized rectified input voltage; and
filtering the received rectified input voltage comprises digitally filtering the digitized rectified input voltage.

4. The method of claim 1, wherein determining the average of the inductor current of the PFC comprises sampling an inductor current during a midpoint of a turn-on time of a switch coupled to an inductor of the PFC and filtering the sampled inductor current.

5. The method of claim 4, wherein sampling the inductor current comprises measuring a voltage across a resistor coupled in series with the switch coupled to the inductor of the PFC.

6. The method of claim 1, further comprising compensating the determined average inductor current according to $iL_{,sampled}$, $$\frac{t_{on}}{T_{sw}} \frac{v_o}{v_o - v_g},$$

wherein $i_{L,sampled}$ is an inductor current sampled in a middle of the turn-on time $t_{on}$ of a switch of the PFC, $T_{sw}$ is a switching period of the switch in the PFC, $v_o$ is an output voltage of the PFC, and $v_g$ is the rectified voltage signal of the PFC.

7. A method of measuring an input power of a power factor converter (PFC), the method comprising:
monitoring a rectified voltage signal from an input of the PFC;
determining a pulse timing value of the PFC; and
determining the input power by multiplying the monitored rectified voltage signal with the pulse timing value of the PFC to form multiplied samples and integrating the multiplied samples.

8. The method of claim 7, wherein:
the monitoring the rectified voltage signal from the input of the PFC comprises sampling a rectified voltage signal from an input of the PFC to obtain sampled values;
the multiplying the monitored rectified voltage signal with the pulse timing value of the PFC to form the multiplied samples comprises multiplying the sampled values with the pulse timing value of the PFC to form the multiplied samples; and
the integrating the multiplied samples comprises accumulating the multiplied samples.

9. The method of claim 7, wherein the pulse timing value is determined according to:

$$t_{on} \frac{t_{cyc}}{T_{sw}},$$

where $t_{on}$ is an on-time of a switch in the PFC, $t_{cyc}$ is a time during which current flows in an inductor of the PFC, and $T_{sw}$ is a switching period of the switch in the PFC.

10. The method of claim 7, wherein the pulse timing value is obtained from an input signal of a pulse-width modulator of the PFC.

11. The method of claim 7, further comprising multiplying the determined input power by a first scaling factor to form a scaled measured value.

12. The method of claim 11, further comprising correcting the scaled measured value using a correction factor.

13. The method of claim 12, further comprising determining the correction factor comprising:
providing a test signal to the PFC;
measuring an input power of the PFC using a reference power meter to form a reference measurement;
comparing the reference measurement to a scaled measure value; and
determining the correction factor based on the comparing.

14. The method of claim 13, wherein determining the correction factor further comprises:
sweeping an amplitude of the test signal over a plurality of amplitudes; and
determining a plurality of correction factors corresponding to the plurality of amplitudes.

15. The method of claim 7, wherein determining the input power further comprises mapping the multiplied value to a calibrated input power using a mapping function.

16. The method of claim 15, further comprising determining the mapping function comprising:
providing a test signal to the PFC;
measuring an input power of the PFC using a reference power meter to form a reference measurement;
comparing the reference measurement to a scaled measure value; and
determining the mapping function based on the comparing.

17. The method of claim 16, wherein the mapping function comprises a piecewise linear mapping function.

18. A power supply controller comprising:
a first interface configured to be coupled to a rectified input voltage of a power factor converter (PFC); and
a pulse-width modulator having an output at a second interface configured to activate a switching transistor of the PFC, wherein the power supply controller is configured to sample the rectified input voltage to obtain sampled values, determine a pulse timing value, and determine an input power by multiplying the sampled values with the pulse timing value to form multiplied samples and accumulating the multiplied samples.

19. The power supply controller of claim 18, wherein the pulse timing value is determined according to:

$$t_{on} \frac{t_{cyc}}{T_{sw}},$$

where $t_{on}$ is an on-time of a switch in the PFC, $t_{cyc}$ is a time during which current flows in an inductor of the PFC, and $T_{sw}$ is a switching period of the switch in the PFC.

20. The power supply controller of claim 18, wherein the pulse timing value is obtained from an input signal of a pulse-width modulator of the PFC.

21. The power supply controller of claim 18, wherein the power supply controller is further configured to multiply the accumulated multiplied samples by a first scaling factor to form a scaled measured value.

22. The power supply controller of claim 21, wherein the power supply controller is further configured to correct the scaled measured value using a correction factor.

23. The power supply controller of claim 18, further comprising mapping the accumulated multiplied samples to a calibrated input power using a mapping function.

24. The power supply controller of claim 18, further comprising an analog-to-digital converter having an input coupled to the first interface.

25. The power supply controller of claim 18, further comprising the PFC.

* * * * *